(12) United States Patent
Huang

(10) Patent No.: US 7,525,861 B2
(45) Date of Patent: Apr. 28, 2009

(54) MEMORY POWER DELIVERY NOISE SUPPRESSION

(75) Inventor: Lilly Huang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 217 days.

(21) Appl. No.: 11/322,903

(22) Filed: Dec. 29, 2005

(65) Prior Publication Data

US 2007/0153605 A1  Jul. 5, 2007

(51) Int. Cl.
*G11C 7/00* (2006.01)
(52) U.S. Cl. .................. 365/222; 365/191; 365/198; 365/210.12

(58) Field of Classification Search .............. 365/222, 365/198, 191, 210.12; 702/108; 323/284; 307/43
See application file for complete search history.

(56) References Cited

U.S. PATENT DOCUMENTS

| 6,281,724 B1* | 8/2001 | Ellis ........................... 327/143 |
| 6,789,036 B2* | 9/2004 | Ostrom et al. .............. 702/108 |
| 2003/0090255 A1* | 5/2003 | Bassett et al. ............... 323/284 |

* cited by examiner

*Primary Examiner*—Pho M. Luu
(74) *Attorney, Agent, or Firm*—Robert D. Anderson

(57) ABSTRACT

A voltage regulator provides an operation voltage to a memory system and a transient voltage supply adjusts the operation voltage provided by the voltage regulator during transient events of the memory system.

19 Claims, 3 Drawing Sheets

மாற்றம்...

MEMORY POWER DELIVERY NOISE SUPPRESSION

TECHNICAL FIELD

The inventions generally relate to memory power delivery noise suppression.

BACKGROUND

In personal computers current programs and data that are in use are stored in system memory. The system memory holds the instructions that the processor executes and also holds the data that those instructions work with. System memory is often referred to as simply "memory". System memory is an important part of the main processing subsystem of the computer, and is typically coupled with the processor, cache, motherboard, and chipset.

Memory requires power to be delivered so that the supplied voltage is maintained properly. A voltage regulator (VR) has previously been used to ensure the proper voltage supply level. However, a voltage transient noise can occur in the power supply that can cause the system memory to function improperly. This has particularly become an issue in upcoming next generations of memory platforms. Therefore, a need has arisen to ensure that transient noise in the voltage provided to memory systems is minimized and/or controlled within an acceptable range.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Some embodiments of the inventions relate to memory power delivery noise suppression.

In some embodiments a voltage regulator provides an operation voltage to a memory system and a transient voltage supply adjusts the operation voltage provided by the voltage regulator during transient events of the memory system.

In some embodiments a system includes a memory system, a voltage regulator and a transient voltage supply. The voltage regulator provides an operation voltage to the memory system and the transient voltage supply adjusts the operation voltage provided by the voltage regulator during transient events of the memory system.

In some embodiments an operation voltage is provided to a memory system and the operation voltage provided to the memory system is adjusted during transient events of the memory system.

According to some embodiments an alternative mechanism in system memory power delivery design is implemented. The mechanism includes a point-of-load voltage regulator on a base board or a module, a memory card and/or memory module, and/or Dynamic Random Access Memory (DRAM) devices. According to some embodiments, voltage control is performed in order to suppress transient noise in memory device (for example, DRAM device) power delivery. A transient noise introduced into the memory system supply voltage due, for example, to load stepping current often causes supply voltage undershoots and/or overshoots. Supply voltage undershoots and/or overshoots can lead to memory performance degradation and/or signal integrity issues. The worst case load transient event occurs, for example, during the memory operation of memory refresh and/or auto refresh. Due to DRAM architecture design, the worst case load transient event occurs at a fixed time interval or in a constant time period.

According to some embodiments, by adjusting the voltage level of the voltage regulator (VR) output or an equivalent voltage reference based on memory refresh or auto-refresh cycle, voltage transient noise can be minimized and/or controlled within an acceptable range. That is, memory transient Alternating Current (AC) noise can be suppressed actively in a controllable manner. This avoids the addition of more and more passive decoupling capacitors in the power delivery network as used in previous approaches to the problem.

Figure 1:
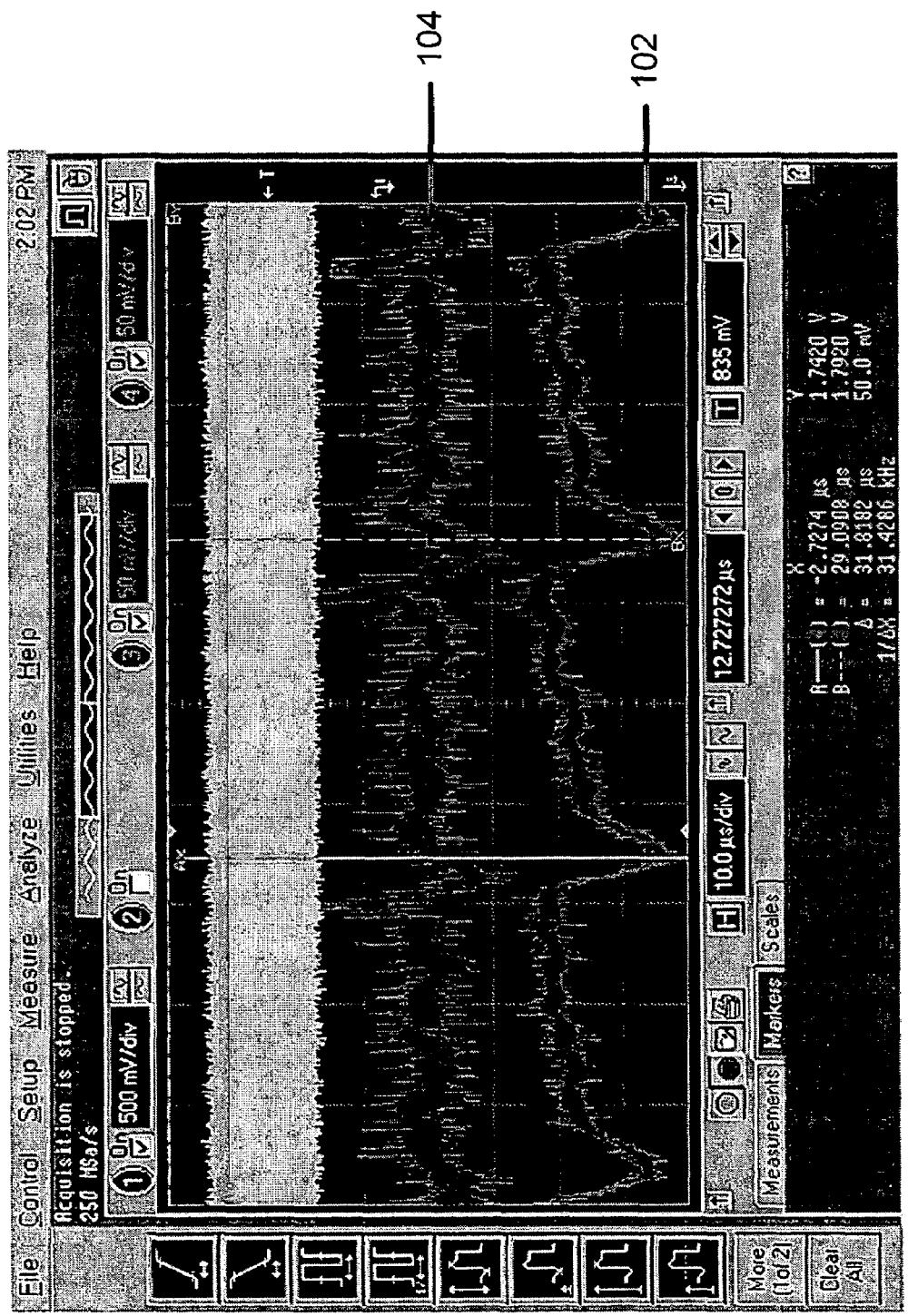
FIG. 1 illustrates waveforms relating to power delivery during memory system operation according to some embodiments of the inventions.

FIG. 1 illustrates waveforms 100 relating to power delivery during memory system operation. Waveforms 100 include a memory current load change waveform 102 and a transient memory supply voltage waveform 104 according to some embodiments. The load current 102 and the voltage transient 104 include a dipping of the current and a voltage spike after the current dip. For example, as illustrated in FIG. 1, the current dip and/or voltage spike occur roughly in a periodic manner every 32 us. Such a current dip and/or voltage spike can occur, for example, due to a memory auto-refresh.

Figure 2:
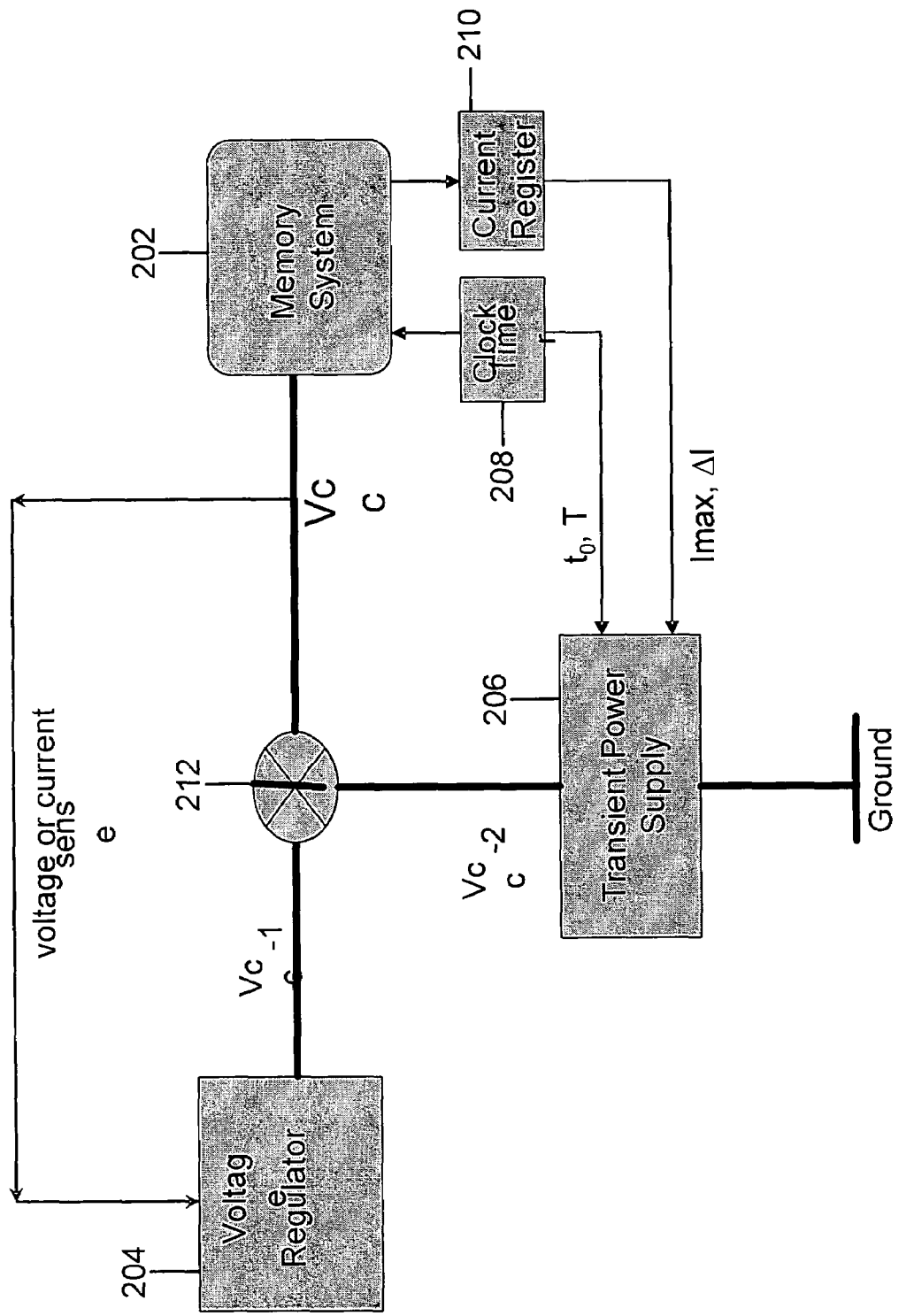
FIG. 2 illustrates a memory system and memory system power delivery circuitry according to some embodiments of the inventions.

FIG. 2 illustrates a memory system and memory system power delivery circuitry 200 according to some embodiments of the inventions. The system 200 includes a memory system (and/or memory subsystem) 202, a voltage regulator (VR) 204 (for example, a master voltage regulator), a transient voltage supply 206 (for example, a pull-up/pull-down slave transient voltage supply), a clock timer 208, a current register (or transient load register) 210, and a summation device 212. According to some embodiments memory subsystem 202 includes one or more memory chips and/or memory modules, one or more DRAM chips and/or DRAM modules, one or more Dual In-Line Memory Modules (DIMMs), one or more Double Data Rate (DDR) memory chips and/or DDR memory modules, and/or one or more future generation memory chips and/or memory modules.

The power delivery scheme 200 illustrated in FIG. 2 allows for a variable voltage regulator (VR) output and inherent feedback control. Voltage regulator 204 (for example, a master VR) supplies power to the memory system 202 in all circumstances where memory system 202 needs power. In response to a voltage or current sense, voltage regulator 204 provides a voltage Vcc-1. The transient voltage supply 206 powers up during transient events of the memory system 202. The voltage supplied by transient voltage supply 206 provides a voltage Vcc-2 in order to pull-up or pull-down the operation voltage Vcc ultimately supplied to memory system 202. The voltage Vcc-2 supplied by transient voltage supply 206 to pull-up or pull-down the operation voltage Vcc is controlled in response to outputs from the clock timer 208 and the current register 210. The outputs provided by the clock timer 208 include an initial time $t_0$ and a period T of the control signal provided to the memory system (for example, an initial time and a period of a memory control signal). The outputs provided by the current register 210 include a maximum current Imax demanded by the memory system 202 and a step current "delta I" demanded by the memory system 202. In response to the initial time $t_0$, the period of the control signal T, the maximum current $I_{max}$ demanded by the memory system 202, and/or the step current "delta I" demanded by the memory system 202, transient voltage supply 206 provides the voltage Vcc-2 that pulls-up/pulls-down the voltage Vcc-1 output from voltage regulator 204 to obtain the operation voltage Vcc input to the memory system 202. According to some embodiments, summation device 212 is a device that provides the simple function of an algebraic sum of two values (voltages Vcc-1 and Vcc-2) to obtain the operation voltage Vcc. In this manner, according to some embodiments, a transient supply is able to be used to suppress voltage transient noise, minimize voltage transient noise, and/or control voltage transient noise within an acceptable range. For example, according to some embodiments, a transient supply is used to maintain voltage transient noise such that the supply voltage remains within 5% of the normal supply voltage (Vcc).

Figure 3:
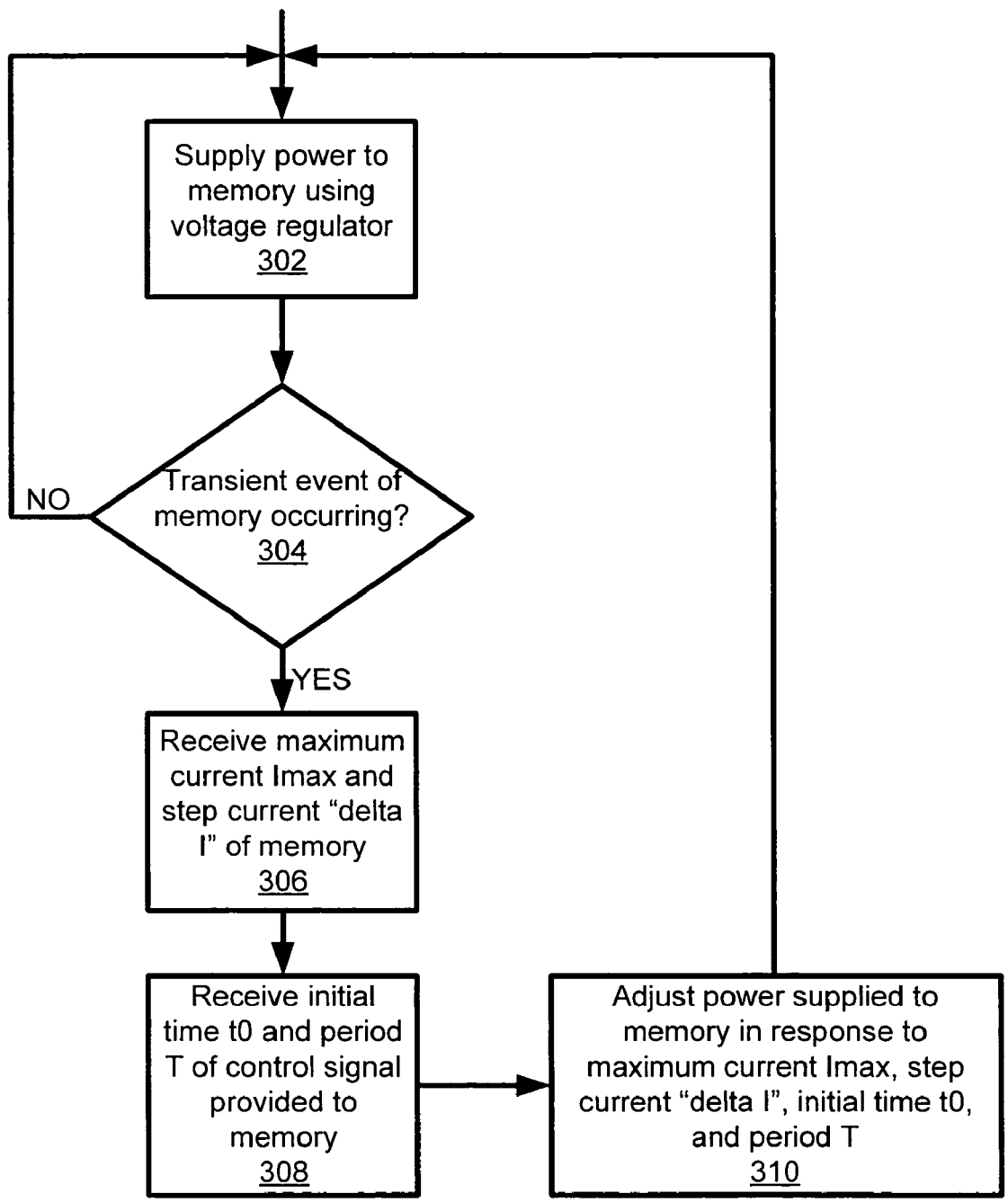
FIG. 3 illustrates a flowchart according to some embodiments of the inventions.

FIG. 3 illustrates a flowchart 300 according to some embodiments. At box 302 power is supplied to a memory, for example using a voltage regulator (for example, in some embodiments a voltage regulator such as voltage regulator 204 illustrated in FIG. 2). At box 304 a determination is made as to whether a transient memory event is occurring. If not, flow returns to box 302. If so, a maximum current Imax and a step current "delta I" is received at box 306 (for example, from a current register such as a current register 210 illustrated in FIG. 2). At box 308 an initial time t0 and a time period T of a control signal provided to the memory is received (for example, from a clock timer such as clock timer 208 illustrated in FIG. 2). At box 310 the power supplied to the memory is adjusted in response to the maximum current Imax, the step current "delta I", the initial time t0, and/or the time period T, and flow is then returned to box 302.

According to some embodiments some or all of the functions performed at box 304, 306, 308, and/or 310 may be performed by a transient power supply (for example, transient power supply 206 illustrated in FIG. 2) and/or a summation device (for example, summation device 212 illustrated in FIG. 2).

Although FIG. 3 has been illustrated without a "start" box and without an "end" box, it is noted that flow 300 may be started or stopped at any time. According to some embodiments, when started flow starts at the top of the drawing and begins at box 302. According to some embodiments, flow may be stopped at any time (for example, during normal operation of the master voltage regulator and/or during a specific transient event).

According to some embodiments, operation voltage (Vcc) of a memory system is stabilized and/or actively controlled within a tolerance window in order to meet performance demands (for example, performance demands for futher memory generations).

According to some embodiments, decoupling capacitors necessary with previous traditional memory system voltage regulation implementations such as for power delivery to DRAM modules or memory systems or subsystems can be removed and/or minimized.

According to some embodiments module real estate can be freed up due to decoupling capacitor placement and/or interconnect layout.

According to some embodiments, a power delivery solution is provided that is entirely or almost entirely independent of the memory system using a few parameters to adjust the transient voltage supply output magnitude, and/or providing design flexibility and/or forward and/or backward compatibilities.

According to some embodiments, memory devices (for example, DRAM devices) operate under a relatively stable voltage supply without requiring additional decoupling capacitors on the module or base board. According to some embodiments, a performance benefit is provided by the replacement of "passive control" with a predetermined "active" control for supply of operational voltage to memory systems (and/or memory modules, memory devices, etc.)

Although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, the interfaces that transmit and/or receive signals, etc.), and others.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and/or state diagrams may have been used herein to describe embodiments, the inventions are not limited to those diagrams or to corresponding descriptions herein. For example, flow need not move through each illustrated box or state, or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. An apparatus comprising:
   a voltage regulator to provide an operation voltage to a memory system; and
   a transient voltage supply to adjust the operation voltage provided by the voltage regulator during transient events of the memory system;
   wherein the transient voltage supply is to adjust the operation voltage in response to an initial time of a control signal input to the memory system, a period of the memory control signal, a maximum current demanded by the memory system, and a step current demanded by the memory system.

2. An apparatus comprising:
   a voltage regulator to provide an operation voltage to a memory system; and
   a transient voltage supply to adjust the operation voltage provided by the voltage regulator during transient events of the memory system;
   wherein the memory system includes a Dynamic Random Access Memory device.

3. An apparatus comprising:
   a voltage regulator to provide an operation voltage to a memory system; and
   a transient voltage supply to adjust the operation voltage provided by the voltage regulator during transient events of the memory system;
   wherein the transient voltage supply is to adjust the operation voltage based on a memory refresh cycle.

4. An apparatus comprising:
   a voltage regulator to provide an operation voltage to a memory system; and
   a transient voltage supply to adjust the operation voltage provided by the voltage regulator during transient events of the memory system;
   wherein the transient voltage supply is to adjust the operation voltage to control voltage transient noise within an acceptable range.

5. The apparatus of claim 4, wherein the transient voltage supply is able to pull-up or pull-down the operational voltage during transient events of the memory system.

6. The apparatus of claim 4, wherein the transient voltage supply is to adjust the operation voltage to suppress transient noise in power delivery to the memory system.

7. The apparatus of claim 4, further comprising a current register to provide to the transient voltage supply a maximum current and a step current demanded by the memory system, the transient voltage supply to adjust the operation voltage in response to the maximum current and the step current provided by the current register.

8. An apparatus comprising:
   a voltage regulator to provide an operation voltage to a memory system;
   a transient voltage supply to adjust the operation voltage provided by the voltage regulator during transient events of the memory system; and
   a clock timer to provide to the transient voltage supply an initial time and a period of a memory control signal input to the memory system, the transient voltage supply to adjust the operation voltage in response to the initial time and the period provided by the clock timer.

9. An apparatus comprising:
   a voltage regulator to provide an operation voltage to a memory system;
   a transient voltage supply to adjust the operation voltage provided by the voltage regulator during transient events of the memory system; and
   a current register to provide to the transient voltage supply a maximum current and a step current demanded by the memory system, the transient voltage supply to adjust the operation voltage in response to the maximum current and the step current provided by the current register.

10. A system comprising:
    a memory system;
    a voltage regulator to provide an operation voltage to the memory system; and
    a transient voltage supply to adjust the operation voltage provided by the voltage regulator during transient events of the memory system;
    wherein the transient voltage supply is to adjust the operation voltage in response to an initial time of a control signal input to the memory system, a period of the memory control signal, a maximum current demanded by the memory system, and a step current demanded by the memory system.

11. A system comprising:
    a memory system;
    a voltage regulator to provide an operation voltage to the memory system; and
    a transient voltage supply to adjust the operation voltage provided by the voltage regulator during transient events of the memory system;
    wherein the transient voltage supply is able to pull-up or pull-down the operational voltage during transient events of the memory system.

12. A system comprising:
    a memory system;
    a voltage regulator to provide an operation voltage to the memory system; and a transient voltage supply to adjust the operation voltage provided by the voltage regulator during transient events of the memory system;
wherein the transient voltage supply is to adjust the operation voltage to suppress transient noise in power delivery to the memory system.

13. A system comprising:
a memory system;
a voltage regulator to provide an operation voltage to the memory system; and
a transient voltage supply to adjust the operation voltage provided by the voltage regulator during transient events of the memory system;
wherein the memory system includes a Dynamic Random Access Memory device.

14. A system comprising:
a memory system;
a voltage regulator to provide an operation voltage to the memory system; and
a transient voltage supply to adjust the operation voltage provided by the voltage regulator during transient events of the memory system;
wherein the transient voltage supply is to adjust the operation voltage based on a memory refresh cycle.

15. A system comprising:
a memory system;
a voltage regulator to provide an operation voltage to the memory system; and
a transient voltage supply to adjust the operation voltage provided by the voltage regulator during transient events of the memory system;
wherein the transient voltage supply is to adjust the operation voltage to control voltage transient noise within an acceptable range.

16. The system of claim 15, further comprising a current register to provide to the transient voltage supply a maximum current and a step current demanded by the memory system, the transient voltage supply to adjust the operation voltage in response to the maximum current and the step current provided by the current register.

17. A system comprising:
a memory system;
a voltage regulator to provide an operation voltage to the memory system;
a transient voltage supply to adjust the operation voltage provided by the voltage regulator during transient events of the memory system; and
a clock timer to provide to the transient voltage supply an initial time and a period of a memory control signal input to the memory system, the transient voltage supply to adjust the operation voltage in response to the initial time and the period provided by the clock timer.

18. A system comprising:
a memory system;
a voltage regulator to provide an operation voltage to the memory system;
a transient voltage supply to adjust the operation voltage provided by the voltage regulator during transient events of the memory system; and
a current register to provide to the transient voltage supply a maximum current and a step current demanded by the memory system, the transient voltage supply to adjust the operation voltage in response to the maximum current and the step current provided by the current register.

19. A system comprising:
a memory system;
a voltage regulator to provide an operation voltage to the memory system; and
a transient voltage supply to adjust the operation voltage provided by the voltage regulator during transient events of the memory system;
wherein the memory system includes at least one memory module.

* * * * *